United States Patent [19]

Kaneko et al.

[11] Patent Number: 4,543,499
[45] Date of Patent: Sep. 24, 1985

[54] I²L CIRCUITRY HAVING OPERATING CURRENT SUPPLIED BY HIGHER-VOLTAGE CIRCUITRY FABRICATED ON SAME CHIP

[75] Inventors: Kenji Kaneko, Hachioji; Minoru Nagata, Kodaira; Makoto Furihata, Gunma; Setsuo Ogura, Takasaki; Takahiro Okabe, Nishitama; Mitsuya Sato, Kokubunji, all of Japan

[73] Assignee: Hitachi, Ltd., Tokyo, Japan

[21] Appl. No.: 366,784

[22] Filed: Apr. 8, 1982

[30] Foreign Application Priority Data

Apr. 8, 1981 [JP] Japan .................................. 56-51783

[51] Int. Cl.⁴ ................. H03K 19/091; H03K 19/092
[52] U.S. Cl. ............................... 307/477; 307/296 R; 307/446; 307/459; 307/475; 307/494
[58] Field of Search ................... 307/296 R, 446, 459, 307/477, 31, 32, 55, 475, 494, 297; 364/488–491

[56] References Cited

U.S. PATENT DOCUMENTS

| | | | |
|---|---|---|---|
| 3,743,850 | 7/1973 | Davis | 307/296 R X |
| 4,013,901 | 3/1977 | Williams | 307/477 X |
| 4,109,162 | 8/1978 | Heuser et al. | 307/477 |
| 4,137,465 | 1/1979 | Hart | 307/477 |
| 4,229,668 | 10/1980 | Ebihara et al. | 307/296 R X |
| 4,243,896 | 1/1981 | Chapron | 307/296 R X |
| 4,300,061 | 11/1981 | Mihalich et al. | 307/297 |
| 4,357,548 | 11/1982 | Preslar | 307/459 X |
| 4,365,316 | 12/1982 | Iwahashi et al. | 307/296 R X |
| 4,374,332 | 2/1983 | Inami et al. | 307/269 X |
| 4,430,582 | 2/1984 | Bose et al. | 307/297 |

Primary Examiner—Stanley D. Miller
Assistant Examiner—D. R. Hudspeth
Attorney, Agent, or Firm—Antonelli, Terry & Wands

[57] ABSTRACT

A semiconductor integrated circuit includes low voltage operation circuitries such as I²L and high voltage operation circuitries operating at a higher voltage than the low voltage operation circuitries. Both of the low and high voltage operation circuitries are implemented in a single semiconductor chip in coexistence with each other. The low voltage operation circuitries are disposed in constant current paths in the high voltage operation circuitries so that the currents once used by the high voltage operation circuits are utilized again by the low voltage operation circuitries. Power dissipation of the whole integrated circuit is thus reduced significantly.

26 Claims, 58 Drawing Figures

FIG. IA
PRIOR ART
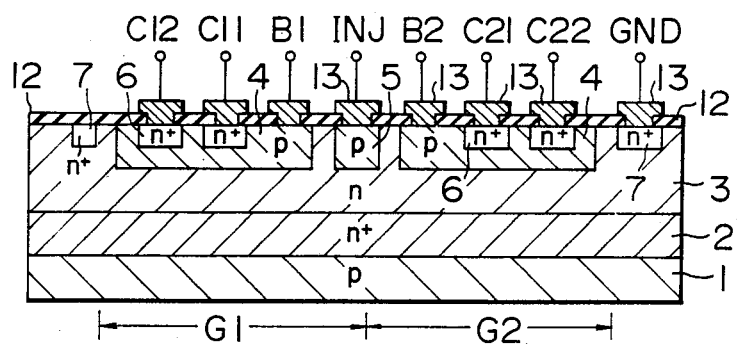
FIG. IB
PRIOR ART
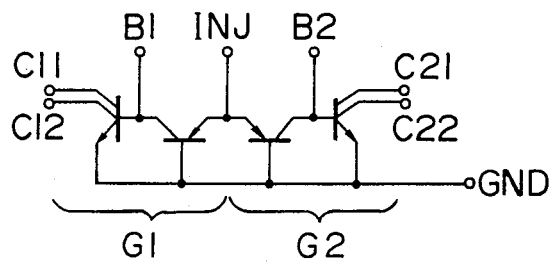

F I G. 4
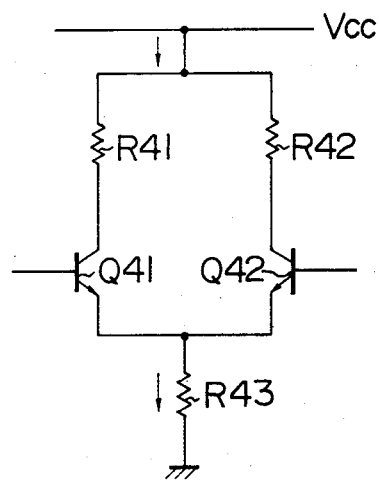
F I G. 5
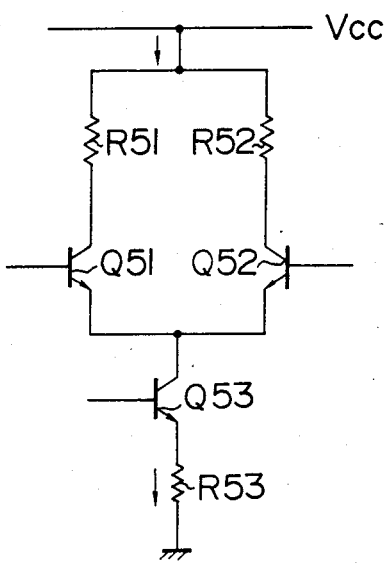
F I G. 6
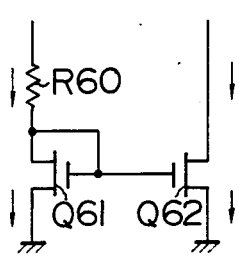
F I G. 7
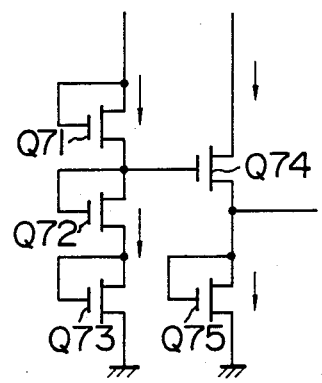

I²L CIRCUITRY HAVING OPERATING CURRENT SUPPLIED BY HIGHER-VOLTAGE CIRCUITRY FABRICATED ON SAME CHIP

The present invention relates generally to a semiconductor integrated circuit. In particular, the invention concerns a circuit configuration of a semiconductor integrated circuit which includes such low voltage circuits as integrated injection logic circuits (hereinafter referred to as I²L circuitry), ECL (Emitter Coupled Logic), TTL (Transistor-Transistor Logic), amplifier circuits and the like adapted for low voltage operation and which assures operation of a reduced power consumption.

In the following description, IIL circuits will be exemplified, in no limitative way, as the low voltage circuit. The I²L circuitry proposed in 1972 exhibits various advantageous features such as easy compatibility with hitherto known bipolar elements, possibility of the being implemented at a high integration density and the capability of a low power dissipation operation at a low voltage (in the range of 0.5 to 1.5 V) and a low current. Thus, the I²L circuitry enjoys popularity in numerous applications.

As the range of applications of I²L circuitry is expanded, the number of gates which can be integrated in a single chip is also increased. The increase in the number of gates leads to a proportionate increasing in a total current consumption to such a level that the I²L circuits take a large proportion of the power consumed in the whole chip even with the low power consumption property of each I²L circuitry. Under the circumstances, there is a demand for further decreasing the power consumption of the I²L circuitry.

The structure of the I²L circuitry is in substance identical with that of the hitherto known bipolar transistor. FIG. 1A of the accompanying drawings illustrates a structure of I²L circuitry for two gates G1 and G2, while FIG. 1B shows an equivalent circuit of the device shown in FIG. 1A. Referring to FIG. 1A, a reference numeral 1 denotes a Si-substrate of p-type conductivity, 2 denotes a buried layer of n⁺-type conductivity, 3 denotes a Si-epitaxial layer of n-type conductivity, 4 denotes p-type base regions of the I²L or collector regions of lateral type pnp-transistors, 5 denotes a p-type injector region of the I²L or emitter region of the lateral pnp-transistor, 6 denotes n-type collector regions of the I²L, 7 denotes n⁺-regions, connected to the ground line, 12 denotes an insulation film, and 13 denotes electrodes. It will be seen that the I²L circuitry is constituted by the upside-down vertical npn-bipolar transistor 3(2), 4 and 6 and the lateral pnp-bipolar transistor 5, 3(2) and 4 and differs from the hitherto known bipolar transistor circuitry in that the epitaxial layer 3 which serves as the collector of the conventional npn-transistor is used as the emitter while the diffusion layer 6 used heretofore as the emitter serves as the collector and that the pnp-transistor and the npn-transistor are so integrated and merged that the collector of the pnp-transistor and the base of the npn-transistor are merged in the same diffusion layer 4. Moreover, the base of the pnp-transistor serves additionally as the emitter of the npn-transistor. In the I²L circuit of this configuration, the pnp-transistor is merged with the npn-transistor, wherein holes are injected from the emitter 5 of the commonbase pnp-transistor. Thus, the emitter of the pnp-transistor is referred to as the injector of the I²L circuitry.

As can be seen from illustration of FIGS. 1A and 1B, the I²L circuitry brings about advantages as follows:
(1) By virtue of the arrangement in which the epitaxial layer is to serve as the emitter region, there can be spared a deep isolation region for isolating the npn-transistors, thereby permitting a significantly increased integration density.
(2) Since the lateral (pnp) transistor is merged with the vertical (npn) transistor, the integration density can be further increased.
(3) Implementation of a single gate solely by the integrated pnp- and npn-transistors permits a low power operation in combination with the fact that the supply voltage may be so low as required to operate a single diode.

Because of the advantageous features described above, the I²L circuitry is used in various and numerous integrated circuits.

When examining configurations of the integrated circuits including I₂L's for practical applications, it will be found that there are few integrated circuits which are constituted solely by I²L's exclusively, but a major proportion of the I²L chips is occupied by such integrated circuits in which the I²L is employed in combination with other logic circuits and analog circuits. The integrated circuit of the latter type are usually operated by using a source voltage of 3 to 30 volts which is obviously higher than the operation voltage of the I²L.

Hitherto, in the integrated circuit in which the I²L circuitries coexist with other circuits which require higher operation voltages, the power consumption or dissipation of the I²L occupies only a small part in the whole power dissipation of the integrated circuit. Generally, the current consumption of the I²L for a single gate is usually in the range of several micro amperes to 100 μA. On the other hand, the current consumption of other circuits and in particular that of an analog lies in most cases in a range of several hundred micro-amperes to several milli-amperes. Under these circumstances, although the earlier I²L circuitry which incorporates therein a relatively small number of gates involves substantially no serious problem as to the power consumption, the present-day integrated circuit which can incorporate 1000 or more gates implemented by the I²L circuitries as the result of rapid development of the I²L circuit technology which allows the number of gates integrated in the I²L configuration to be significantly increased demands a large current for the operation even at a low voltage. To meet such demand, the use of the conventional power supply, e.g. rated 5 to 30 volts, is not preferred in view of the involved poor efficiency. In this connection, it is also noted that in the integrated circuit which includes the increased number of gates in the I²L configuration, the other circuits provided in coexistence with the I²L gates tend to be implemented on a larger and larger scale in order to realize correspondingly complicated functions, which means that the power consumption or dissipation of the integrated circuit on the whole tends to increase.

An object of the present invention is to provide a semiconductor integrated circuit of a low power consumption.

Another object of the present invention is to provide a semiconductor integrated circuit which incorporates in a same semiconductor chip low voltage operation circuits which operate with a substantially constant current such as I²L circuitries in combination with other circuits requiring higher voltages for operation and whose power consumption is significantly reduced as a whole. The use of the low voltage circuitries which operate with a substantially constant current in a novel circuit configuration does not require a substantial increase of the supply voltage for the integrated circuit.

In view of the above and other objects which will be more apparent as description proceeds, it is proposed according to an aspect of the invention that, in the light of the fact that the low voltage operation circuitries such as I²L circuitries and the like operate at low voltages, a current which has been hitherto left flowing wastefully in a high voltage operation circuitry which is adapted to be operated at a higher voltage than that of the I²L circuitry is effectively utilized for operation of the low voltage operation circuitries, to thereby reduce significantly the power consumption or dissipation of the semiconductor integrated circuit on the whole.

According to another aspect of the present invention, there is proposed a semiconductor integrated circuit in which a current which has been heretofore left flowing wastefully in a high voltage operation circuitries such as an analog circuitry can be utilized as an effective current for the low voltage operation circuitries to thereby decrease remarkably the power consumption of the integrated circuit as a whole and in which the area of a chip is reduced by implementing in an integral configuration the analogue circuitries or the like high voltage operation circuitries and the I²L circuitries or the like low voltage operation circuitries.

According to another aspect of the present invention, there is proposed an integrated semiconductor circuit in which the I²L or the like low voltage operation circuitries are inserted in a constant current path present in analog or the like high voltage operation circuitry adapted to be operated at a higher voltage than the I²L or the like circuitries, to thereby allow the current of the constant current path to be utilized effectively for the operation of the I²L or the like circuitries and thence to attain a remarkable decrease in the power consumption or wastage of the whole semiconductor integrated circuit.

The present invention will be apparent from the following detailed description taken in conjunction with the accompanying drawings, in which:

FIGS. 1A and 1B are views illustrating a structure of an I²L circuitry;

FIGS. 2A, 2B, 3A, 3B, 4, 5, 6 and 7 are views showing various circuits having constant current paths, adapted to be hybridized with IIL circuitries;

FIGS. 29A, 29B and 29C are views illustrating a hitherto known circuit in which an I²L circuitry is incorporated in coexistence with an analog circuit or the like;

When circuits which are provided in combination or in hybridization with I²L circuitries are examined in detail, it will be found that there exist many circuit portions through which signal currents do not flow but constant currents or D.C. currents do flow and that the power consumed in these constant current circuit portions is of a significant amount. Typical examples of such circuits are illustrated in FIGS. 2A to 7.

Figure 2A:
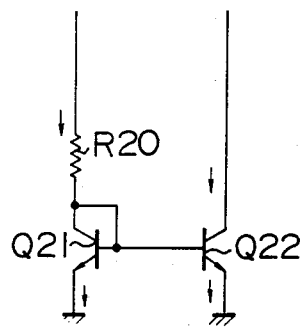
Figure 2B:
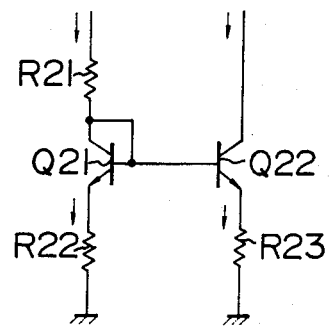

FIGS. 2A and 2B show typical examples of constant current source circuits which are usually employed in many applications. Referring to these figures, emitter paths of transistors Q21 and Q22, paths extending through resistor R20 or R21 and collector paths of the transistor Q22 constitute respective constant current paths. These paths serve to supply bias currents to other circuit portions and determine the operational point of the circuit. In essence, these currents are, so to say, loss or wastage currents. In FIGS. 2A and 2B and the following figures, the constant current paths through which substantially constant currents flow are indicated by arrows "↓".

Figure 3B:
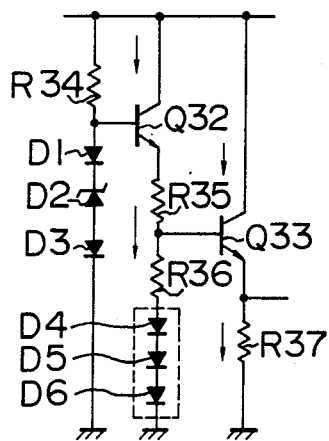
Figure 3A:
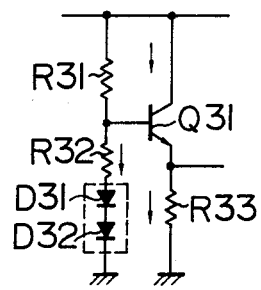

FIGS. 3A and 3B show typical examples of constant voltage source circuits each adapted to supply a constant voltage to other circuit portions. In the circuit shown in FIG. 3A, a base voltage of a transistor Q31 is substantially constant, while a current flowing through diodes D31 and D32 is also constant. Further, a collector current of the transistor Q31 as well as a current flowing through a resistor R33 is also substantially constant. These currents constitute biases for determining the output voltage. In the case of the circuit shown in FIG. 3B, substantially constant currents flow through current paths constituted by resistors R35 and R36 and diodes D4, D5 and D6, collector paths of transistors Q32 and Q33 and a current path extending through a resistor R37, respectively. These currents constitute biases for determining the constant voltage output.

FIG. 4 shows a typical example of a differential amplifier. Although emitter currents of transistors Q41 and Q42 of this circuit are not constant, the sum of the emitter currents of these transistors Q41 and Q42 is constant, whereby the current flowing through a resistor R43 as well as a current flowing through a current path formed between a voltage supply source Vcc and a interconnection of resistors R41 and R42 substantially constant.

FIG. 5 shows another example of the differential amplifier similar to the one shown in FIG. 4. In the case of this circuit, the sum of emitter currents of transistors Q51 and Q52 is made constant by a transistor Q53. Accordingly, a current flowing along a path including a resistor R53 as well as a current flowing along a current path formed between a voltage supply source Vcc and a interconnection between resistors R51 and R52 is also constant.

FIG. 6 shows an example of a constant current source circuit constituted by insulated-gate field effect transistors (hereinafter referred to as MOS transistor). In this circuit, drain currents and source currents of MOS transistors Q61 and Q62 are constant, as is in the case of the circuits shown in FIGS. 2A and 2B. In the figure, R60 represents a load through which a constant bias current flows.

FIG. 7 shows an example of a constant voltage source circuit constituted by MOS transistors. A constant current flows through MOS transistors Q71, Q72 and Q73. Further, a constant current flows through a MOS transistor Q75 with a drain current of a MOS transistor Q74 being constant. These constant currents constitute bias currents for forming the output voltage.

In a certain integrated circuit, the total current in an analog circuit is of the order of 22 mA and the current flowing through bias circuits such as those mentioned above amount to 11.3 mA, say, 50% or more of the current flowing in a whole analog circuit.

According to an aspect of the present invention, a low voltage circuit or circuits which operates with a constant current is inserted in a constant current path of the high voltage circuit exemplified as above.

Realization of such circuit parts of very low operating voltage as IIL has enabled substantial utilization of the above-mentioned circuit configuration in semiconductor integrated circuits.

For example, IIL requires a supply voltage of only about 0.5 to about 1.5 volts, such IIL circuitries can be inserted into semiconductor integrated circuits having rated supply voltages of the order of 3 to 15 volts, without causing necessity of substantially increasing the supply voltage. From the point of preventing increase of the supply voltage, the operation voltage of the low voltage circuit is preferably at most one half of the supply voltage of the semiconductor integrated circuit. Usually, this ratio of the operation voltage of the low voltage circuit to the supply voltage of the integrated circuit is in a range between about ⅓ and about 1/15. A plurality of low voltage circuit stages connected in series may also be inserted in a high voltage circuit. In such a case, the number of serially inserted stages should be determined on the consideration of the operating voltages of the low voltage circuit and the supply voltage for the integrated circuit.

IIL circuitries are only preferred examples of the low voltage circuit. Any low voltage circuit which can operate at an operating voltage at most equal to about one half of the supply voltage for the semi-conductor integrated circuit can be utilized in the present invention. By the present circuit configuration, an increase in the supply voltage is suppressed and the efficiency of the power consumed in a semiconductor integrated circuit is improved. Thus, it is wasteful to leave the bias currents as they flow.

Now, novel features and advantages of the present invention will be described in detail in conjunction with exemplary embodiments thereof.

Figure 8A:
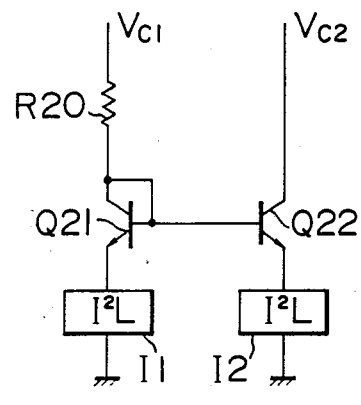
FIGS. 8A to 28B are views illustrating various embodiments of the invention.
Figure 8B:
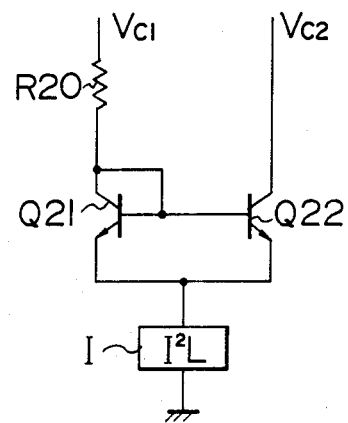
Figure 8C:
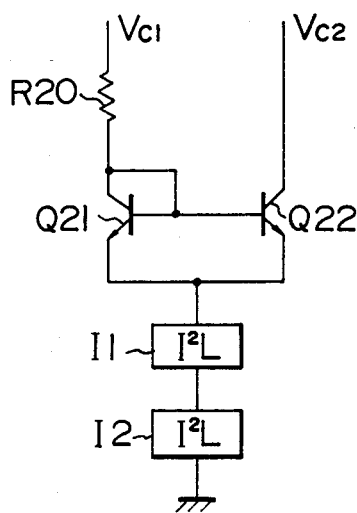

FIGS. 8A, 8B and 8C illustrate configurations of constant current source circuits in each of which arrangement is made such that the current can be utilized effectively, i.e. with less wastage or loss. As described hereinbefore in conjunction with the constant current circuits shown in FIGS. 2A and 2B, the emitter currents of the transistors Q21 and Q22 of the respective circuit configurations are substantially constant. For this reason, it is possible to insert I²L circuit or circuitries between the ground or earth and the emitters of the transistors Q21 and Q22 in the respective circuits as indicated by I, I1 and I2. In FIG. 8A, each one IIL is connected between the emitter of each transistor and the ground. In FIG. 8B, an IIL is connected between the interconnection of the emitters and the ground. In FIG. 8C, two IIL's are stacked in series. Each of the I²L circuitries may correspond to the one shown in FIGS. 1A and 1B. In FIGS. 8A and 8B, the injector terminals of the I²L circuitries are connected to the respective emitters or the common emitter of the transistors Q21 and Q22, while the ground terminals of the I²L circuitries are connected to the inherent ground terminals of the constant current source circuit. Since a pn-junction exists between the injector terminal and the ground terminal of the I²L circuitry, there is produced across these terminals a voltage (of about 0.7 volts) which corresponds to a forward voltage drop of a diode. Accordingly, the emitter potentials of the transistors Q21 and Q22 of the illustrated constant current source circuits are higher than those of the hitherto known similar circuit by the forward voltage drop of a diode. Since the supply voltage Vc1 and the collector voltage Vc2 of the transistor Q22 are usually selected sufficiently higher than the forward voltage drop of a diode, insertion of the I²L circuitry or circuitries in the emitter paths of the transistors Q21 and Q22 will involve no material problems.

In place of providing a single I²L circuit block as in the case of the circuit shown in FIGS. 8A and 8B, it is possible to provide two blocks of the I²L circuitries as shown in FIG. 8C or to stack three or more I²L circuitries (stacked IIL circuits may be referred to Japanese Laid-Open Patent Specification No. 78268/1975).

According to the circuit arrangements shown in FIGS. 8A, 8B and 8C, the bias currents which have heretofore been left flowing wastefully can be utilized effectively for the operation of the I²L circuitries. Such utilization becomes more effective by stacking two, three or more I²L circuitry blocks which further reduce the wasted part of the supply voltage in the bias circuit.

Figure 9:
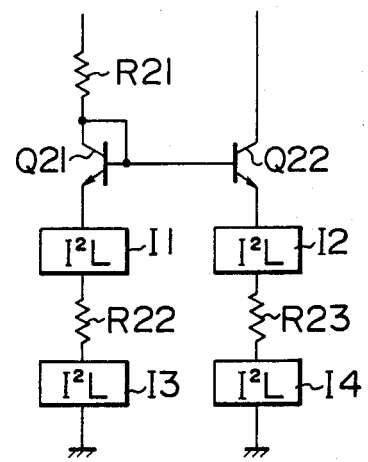

FIG. 9 shows another exemplary embodiment of the invention, according to which I²L circuitries are inserted in emitter current paths of a constant current source circuit, as indicated by I1, I2, I3 and I4. In the case of this exemplary embodiment, the I²L circuitries may be inserted between the emitters of the transistors Q21 and Q22 and resistors R22 and R23, respectively, as in the case of the I²L circuitries I1 and I2, or alternatively or additionally the I²L circuitries I3 and I4 may be interposed between the ground and the resistors R22 and R23, respectively. Further, instead of providing the I²L circuitries connected separately to the lower potential ends of the resistors R22 and R23, it is also possible to connect together these low potential ends of the resistors R22 and R23 and interpose a cascaded stack of the I²L circuitries (I3 and I4) between the connected end of those resistors and the ground.

Figure 10A:
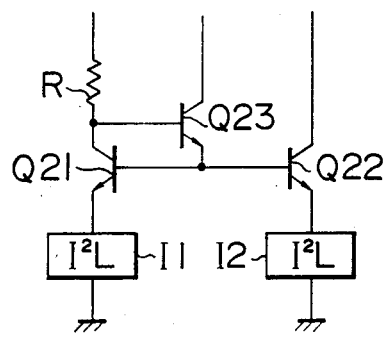
Figure 10B:
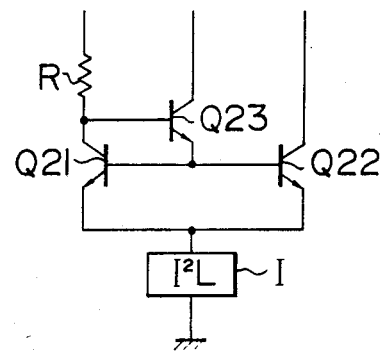
Figure 11A:
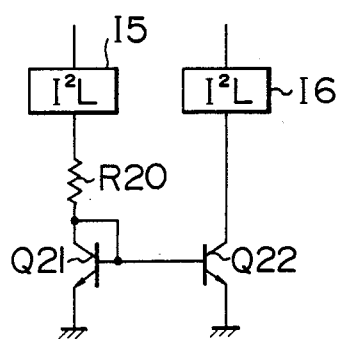
Figure 11B:
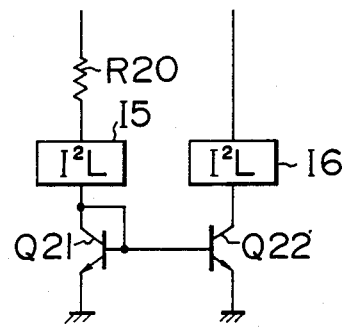
Figure 12A:
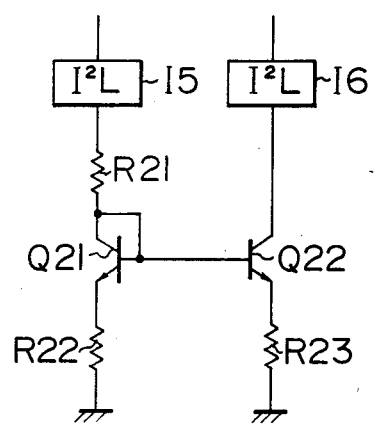
Figure 12B:
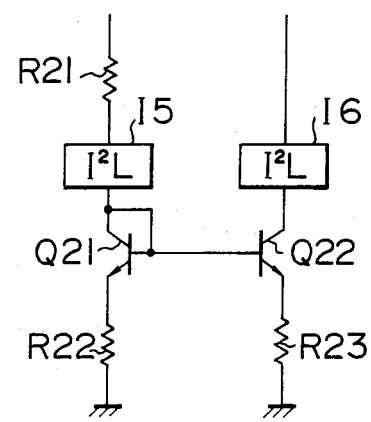
Figure 13A:
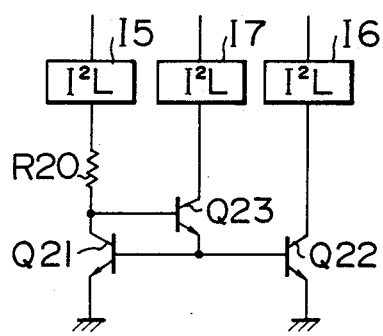
Figure 13B:
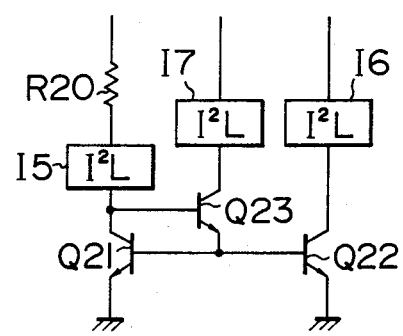

FIGS. 10A and 10B show further exemplary embodiments of the invention applied to another type of the constant current source circuit. From these figures, it will be readily seen that the I²L circuitry (I) or circuitries (I1, I2) are connected in the emitter paths of the transistors Q21 and Q22 in the manner similar to the circuit configurations shown in FIGS. 8A, 8B, 8C and FIG. 9.

It goes without saying that similar or same advantages as those mentioned hereinbefore in conjunction with the embodiments shown in FIGS. 8A, 8B and 8C can also be attained in the exemplary embodiments shown in FIGS. 9, 10A and 10B.

FIGS. 11A, 11B, 12A, 12B, 13A and 13B show circuit arrangements according to further embodiments of the invention, in which the I²L circuitries (I5, I6, I7) are inserted in collector paths of the transistors Q21 and Q22, respectively. Although both the I²L circuitries I5 and I6 are shown to be inserted in the respective collector paths, it is also possible to provide only one of these I²L circuitries. Further, referring to FIGS. 13A and 13B, the I²L circuitry I7 may also be spared.

Insertion of the I²L circuitries in the collector paths of the transistors Q21 and Q22, respectively, is allowed for the same reason as mentioned above in conjunction with the insertion of the I²L circuitries in the emitter paths, respectively, i.e. for the reason that the collector currents are constant. The IIL circuitry may include a level shift circuit when required for coupling to other circuitries.

Besides, the exemplary embodiments shown in FIGS. 11A, 11B, 12A, 12B, 13A and 13B bring about significant advantages mentioned below.

Figure 14:
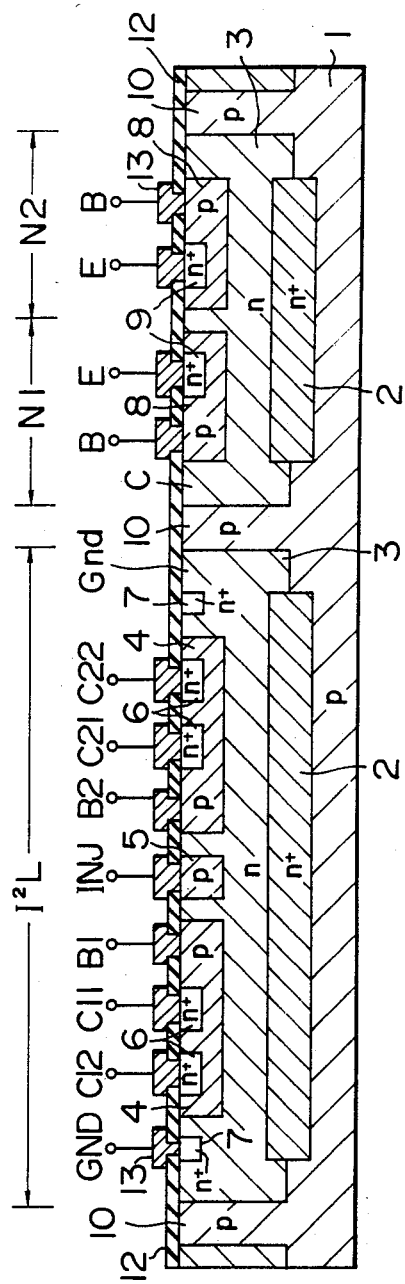

In a hitherto known integrated circuit, conventional npn-transistors N1 (and N2) and the I²L circuitry are isolated from each other by a diffusion layer 10 of a sufficient depth, as is illustrated in FIG. 14. An n-type well includes p-type regions 8 and n+-type regions 9 for forming two transistors N1 and N2 isolated from the I²L block in another n-type well. Certainly, the integrated circuit can be realized with the aid of the isolation layer. As a matter of fact, however, the formation of the isolation layer takes a relatively large chip area of the integrated circuit element and hence limits the packing density. In particular, when a circuit component exhibiting a high breakdown voltage is to be realized, a thick epitaxial layer 3 is made use of for providing a high breakdown voltage. Then, the isolation region which should penetrate through the epitaxial layer inevitably becomes deep. In this case, the isolation region cannot be diffused only depthwise of the epitaxial layer but is also diffused in the lateral directions over a substantially a similar distance as the diffusion in the depthwise direction of the epitaxial layer. Accordingly, adequate margins have to be reserved between the respective circuit components and the isolation diffusion, which means that chip area of the integrated circuit element as a whole is correspondingly increased. It is self-explanatory that the area of a chip in which the integrated circuit is realized can be made smaller as the number of the isolation regions provided between respective circuit components is made smaller.

Figure 15:
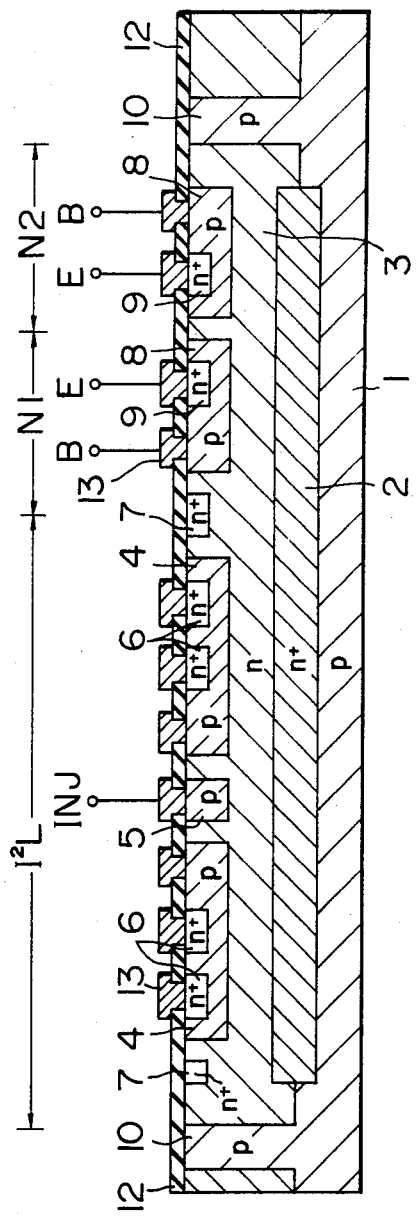

In this connection, reference is again made to FIG. 11A to FIG. 13B showing the circuit arrangements in which the I²L's are inserted in the collector paths of the conventional npn-transistors. In these cases, e.g. in FIG. 11A, the collector of the transistor Q22 is at the same potential as the ground terminal of the associated I²L circuitry I6. Accordingly, it is possible to realize both the transistor Q22 and the I²L circuitry I6 in one and the same isolated region 3 as illustrated in FIG. 15. In FIGS. 14 and 15, one of the transistors N1 and N2 can be used as the transistor Q22 and the other transistor for another purpose. More specifically, no isolation region is required to be provided between the transistor N1 or N2 and the I²L circuitry, being different from the hitherto known structure shown in FIG. 14, whereby chip area of the integrated circuit can be significantly reduced.

In conjunction with implementation of the I²L circuitry and the transistor for other usage in the same isolated region, there may possibly arise such a problem in dependence on the adopted circuit configuration that a parasitic lateral pnp-transistor may be formed with a base constituted by the n-type epitaxial layer 3 between the p-type base 4 or the p-type injector 5 of the npn-transistor of the I²L circuitry and the p-type base 8 of the usual npn-transistor, whereby a parasitic thyristor operation may take place due to the cooperation of the parasitic pnp-transistor and the usual npn-transistor. The n+-type diffusion 7 disposed between the p-type regions 4 and 8 reduces the occurrence of such parasitic transistor.

Figure 16:
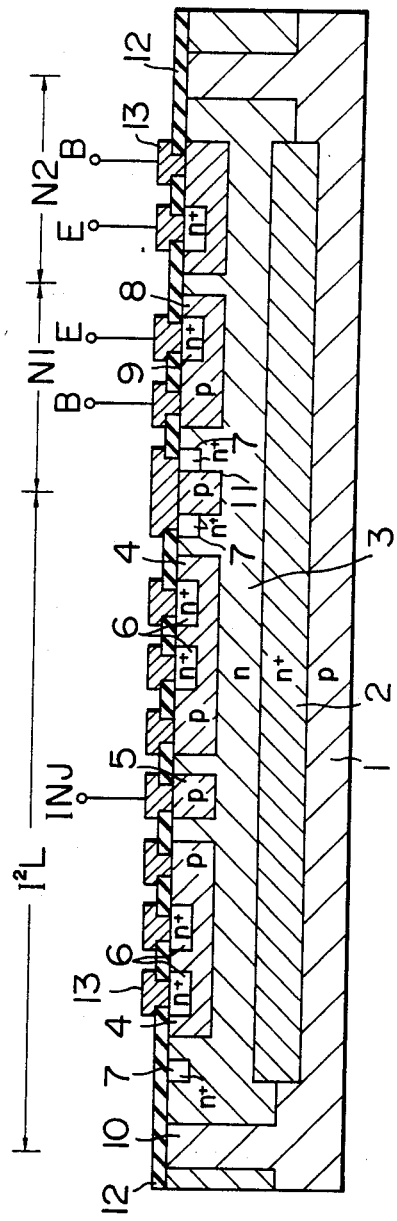

An exemplary embodiment of the invention which is intended to more fully prevent the parasitic thyristor operation is illustrated in FIG. 16. As can be seen from the figure, a p-conductivity type semiconductor region 11 of a relatively small depth with respect to the epitaxial thickness is provided between the I²L circuitry and the usual npn-transistor N1 and connected to the epitaxial layer 3 through the n+-type region 7 so that holes injected into the epitaxial layer 3 from the base 4 of the I²L circuitry or the base 8 of the npn-transistor can be absorbed. The p-region 11 and the n+-region 7 may be formed concurrently with the formation of other regions.

Figure 17:
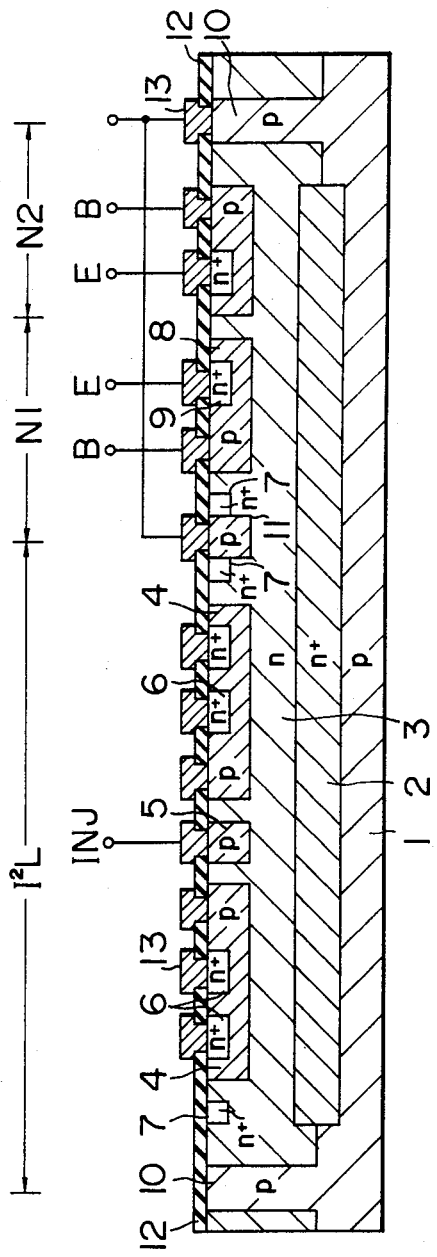

FIG. 17 shows another embodiment of the invention provided with the means for preventing the parasitic thyristor operation. As in the case of the structure illustrated in FIG. 16, a p-conductivity type semiconductor region 11 of a relatively small depth is formed between the I²L circuitry and a usual npn-transistor. This region 11 is however connected to the semiconductor substrate 1 in the case of the structure shown in FIG. 17. This structure also attains a similar effect as is in the case of the structure shown in FIG. 16.

In connection with the structures shown in FIGS. 16 and 17, it is to be noted that the p-conductivity type semiconductor layer 11 formed between the I²L circuitry and the usual npn-transistor N1 can be satisfactorily realized by a semiconductor region having a shallow junction, thus making it unnecessary to reserve a large distance between the I²L and the transistor N1, differing from the structure shown in FIG. 14 where the isolation layer 10 of a great depth is used. Accordingly, an increased integration density can be attained as compared with the hitherto known device illustrated in FIG. 14.

Figure 18A:
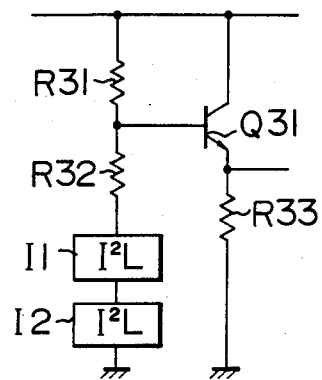
Figure 18B:
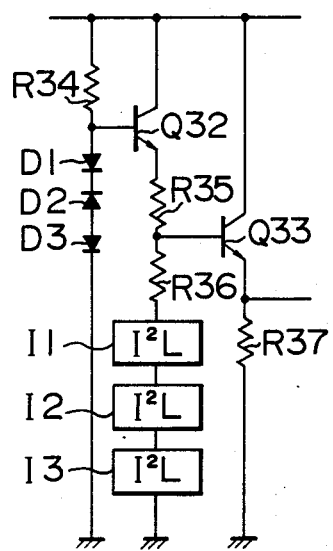

FIGS. 18A and 18B show in circuit diagrams constant voltage source circuits according to further embodiments of the invention in which the I²L circuitries (I1, I2, I3) are inserted in the base bias paths of output transistors.

Figure 18C:
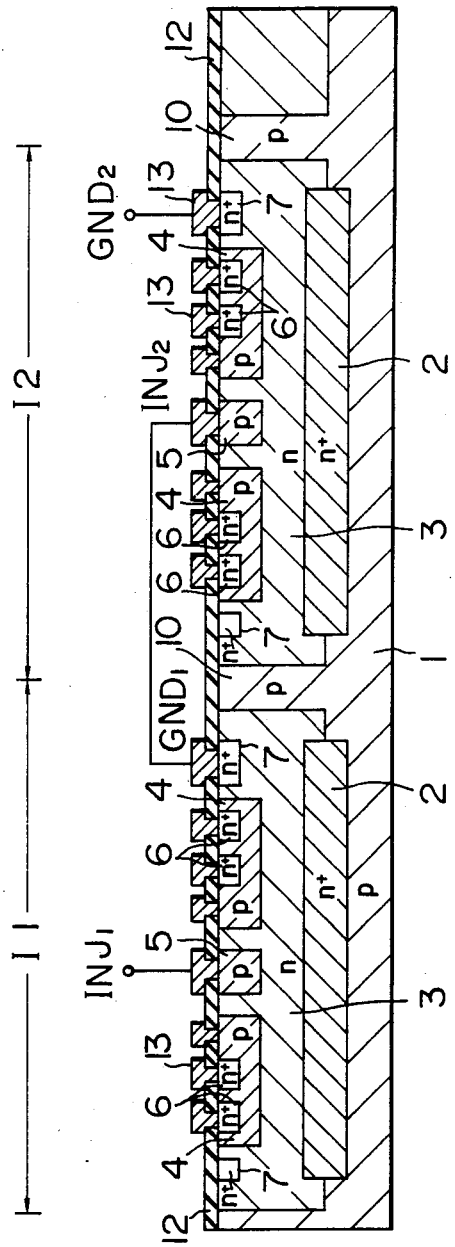

As will be seen from the known circuit configurations shown in FIGS. 3A and 3B, the base circuit of the transistor Q31 or Q33 is often provided with a resistor and diodes for determining the base bias voltage. In this case, a substantially constant current flows through the resistor and the diodes. Thus, the invention also teaches that the diodes be replaced by the I²L circuitry to thereby utilize effectively the current which is heretofore left flowing wastefully in the bias circuit. When a plurality of the I²L circuitries or blocks are stacked in series and inserted in place of the diodes (see FIGS. 3A and 3B), the current can be utilized more effectively. By way of example, a number of the I²L gates as required may be divided into two I²L blocks or circuitries I1 and I2, as shown in FIG. 18A, wherein the injector terminal of the I²L circuitry I1 is connected to the resistor R32 while the ground terminal thereof in turn is connected to the injector terminal of the I²L circuitry or block I2. The ground terminal of the I²L circuitry I2 is connected to the ground potential terminal of the integrated circuit. When the current required for the operation of all the I²L circuitries is represented by Io, this current can be reduced to one half (i.e. Io/2) by stacking the two divided I²L circuitries or blocks in the manner mentioned above. Stacking of the I²L circuitries in practical applications can be accomplished by isolating the I²L circuitries I1 and I2 from each other by providing the respective isolated regions in the integrated circuit, as shown in FIG. 18C.

Figure 19A:
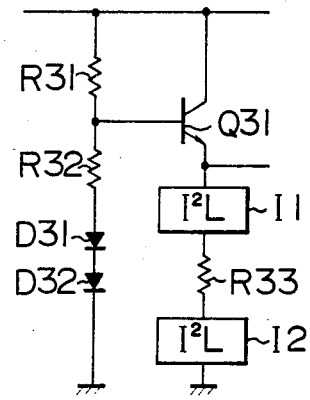
Figure 19B:
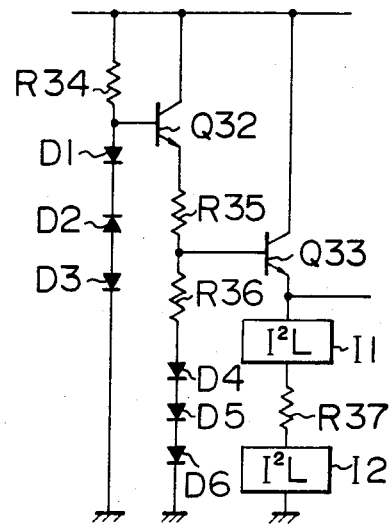

FIGS. 19A and 19B show further exemplary embodiments of the invention in which the I²L circuitries stacked in series are inserted in the emitter path of a transistor of constant voltage source circuit. Each of the transistors Q31 and Q33 has an emitter path of which voltage is constant. Accordingly, the currents flowing through resistors R33 and R37 are individually constant. Thus, it is possible and advantageous to insert the I²L circuitries I1 and I2 in each of the emitter path. Of course, only one of the I²L circuitries I1 and I2 can be inserted instead of the both.

Figure 20A:
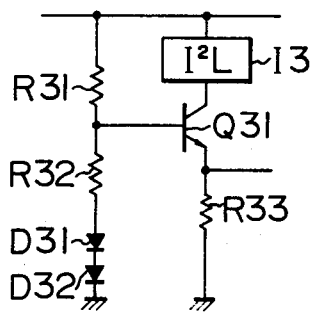
Figure 20B:
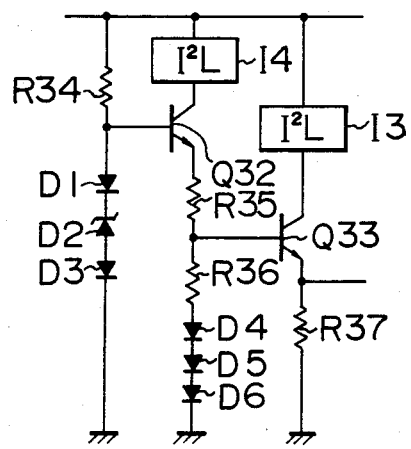

FIGS. 20A and 20B show constant voltage source circuits according to further embodiments of the present invention in which a transistor or transistors constituting the constant voltage source have respective collector paths each provided with the I²L circuitry or circuitries (I3; I3, I4). Since the collector current of the transistor Q31 of the constant voltage source circuit shown in FIG. 20A as well as the collector currents of the transistors Q32 and Q33 constituting the constant voltage source circuit of FIG. 20B are individually constant, it is possible and preferable to insert the I²L circuitry or circuitries in the collector path or paths of the transistor Q31 or transistors Q32 and Q33. Needless to say, only one of the I²L circuitries I3 and I4 can be inserted instead of the both in the case of the circuit shown in FIG. 20B. These embodiments also bring about the advantage that the I²L circuitry and the associated transistor can be disposed in the same isolated region in the same manner as described hereinbefore in conjunction with the exemplary embodiments shown in FIGS. 15, 16 and 17.

It goes without saying that each of the I²L circuitries in the embodiments shown in FIGS. 19A, 19B, 20A and 20B may also have stacked stages connected in series in the same manner as described hereinbefore in conjunction with the exemplary embodiments shown in FIGS. 18A and 18B.

Figure 21:
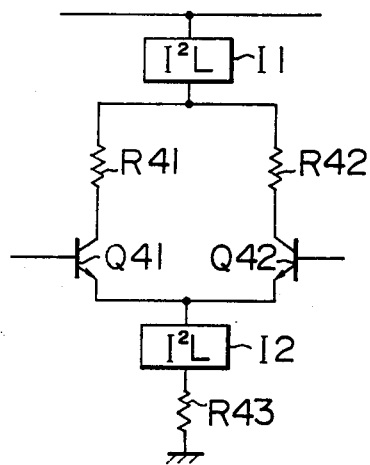
Figure 22:
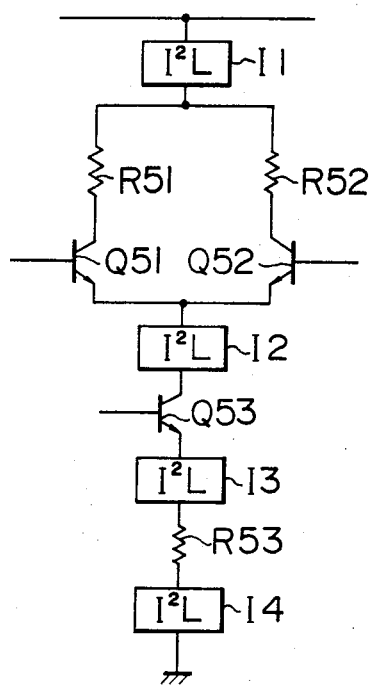

FIGS. 21 and 22 show examples of the differential amplifier circuit to which the invention is applied. As described hereinbefore by referring to FIGS. 4 and 5, the current path extending from the interconnection between the emitters of the differential transistors Q41 and Q42 or the interconnection between the emitters of the differential transistors Q51 and Q52 and the current path extending from the interconnection between the resistors R41 and R42 or the interconnection between the resistors R51 and R52 conduct respective constant currents. Accordingly, it is possible and advantageous to insert the I²L circuits (I1 and I2) in these current paths, respectively. In the circuit shown in FIG. 21, either the I²L circuit I1 or I2 may of course be spared. Further, in the case of the differential amplifier circuit shown in FIG. 22, only one of the I²L circuitries I1, I2, I3 and I4 may be provided with the other three being spared. In brief, it is possible to insert the I²L circuitry or circuitries at circuit portions of the differential amplifiers where the total current remains constant or undergoes only slight variations even when the currents flowing through the individual transistors may grealy vary with the lapse of time.

Figure 23:
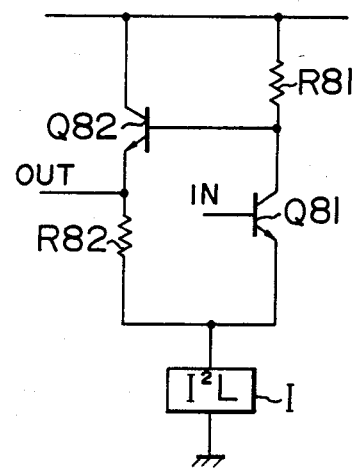

FIG. 23 shows still another embodiment of the invention in which the I²L circuitry is employed in a circuit in which mutual current compensation takes place.

Referring to the figure, when the input potential IN of a transistor Q81 goes high, the collector potential of the transistor Q81 is lowered to thereby increase the emitter current thereof. The collector of the transistor Q81 is connected to the base of another transistor Q82, whereby the lowering of the collector potential of the transistor Q81 is accompanied by lowering of the emitter potential of the transistor Q82, resulting in that the emitter current of the transistor Q82 is decreased. In this connection, the emitter currents $I_{E1}$ and $I_{E2}$ can be given by the following expressions, respectively.

$$I_{E1} = (V_{cc} - V_c)/R$$

$$I_{E2} = (V_c - V_{BE})/R$$

where Vcc represents a source voltage, Vc represents the collector potential of the transistor Q81, and $V_{BE}$ represents a voltage drop (i.e. diode voltage) which makes appearance across the base and the emitter of the transistor Q82 and is substantially constant. Accordingly, the sum of the emitter currents of both transistors Q81 and Q82 is constant, as can be seen from the following expression.

$$I_{E1} + I_{E2} = (V_{cc} - V_{BE})/R.$$

Thus, it is permitted to insert the I²L circuitry in the arrangement shown in FIG. 23. More generally, any circuit composed of a transistor corresponding to Q81 and a load resistor corresponding to R81 as shown in FIG. 23 may be provided with a current compensating circuit in the manner as illustrated in FIG. 23 so as to enable insertion of I²L circuitry at various circuit points in such a circuit. It will thus be appreciated that the circuit arrangement shown in FIG. 23 serves merely for the illustrative purpose, and the fundamental concept of this embodiment can be equally applied to other numerous circuits, in which a constant current flowing through the IIL circuit may be divided in mutually compensating currents to utilize at least one of them in a high voltage circuit.

In the case of the exemplarly embodiments illustrated in FIGS. 21, 22 and 23, the I²L circuitry may be divided into a given number of blocks which are then connected in the stacked configuration, as described hereinbefore.

Figure 24A:
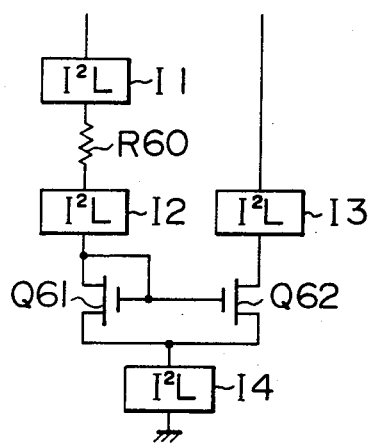
Figure 24B:
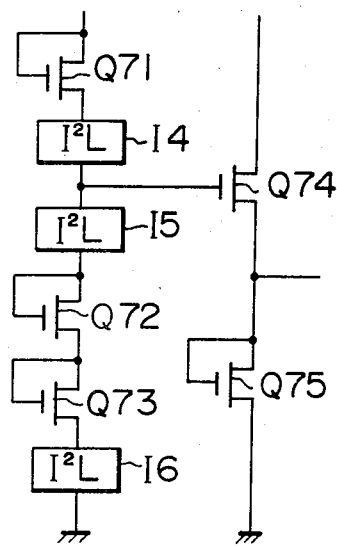

FIGS. 24A and 24B show circuits according to further embodiments of the invention in which MOS transistors are used.

Referring to FIG. 24A, the I²L circuitries I1, I2, I3, I4 are disposed in a constant current source circuit constituted by MOS transistors Q61 and Q62. As described hereinbefore in conjunction with the conventional constant current source circuit shown in FIG. 6, the respective drain currents as well as the source currents of the MOS transistors Q61 and Q62 are constant. Thus, the I²L circuitry or circuitries may be inserted in any one of the associated constant current paths. FIG. 24B shows a constant voltage source circuit constituted by MOS transistors Q74 and Q75 with the I²L circuitry or circuitries I4, I5 and/or I6 being inserted in the constant current path. As described hereinbefore by referring to FIG. 7, the gate bias path of the MOS transistor Q74 composed of MOS transistors Q71, Q72 and Q73 conducts a substantially constant current. Thus, the I²L circuitry or circuitries (I4, I5 and/or I6) may be inserted in this base current path. In these embodiment, it is also possible that the I²L circuitry may be divided into a given number of blocks which are then connected in the stacked configuration.

Figure 25A:
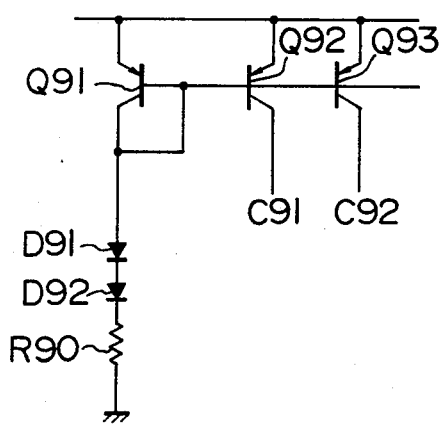
Figure 25B:
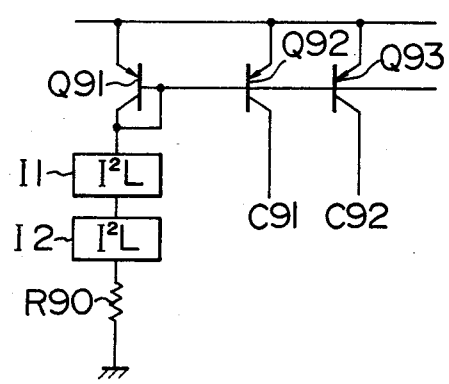

FIG. 25A shows a known constant current source circuit constituted by pnp-transistors. In the case of this circuit, the I²L circuitry or circuitries may be provided in the arrangement shown in FIG. 25B, as is in the constant current source circuit constituted by npn-transistors.

Insertion of the I²L circuitry or circuitries in the constant current source circuit constituted by the pnp-transistors is also very advantageous in that the area of the integrated circuit element can be significantly reduced. FIGS. 26, 27, 28A and 28B show examples of such constant current source circuits.

Figure 27:
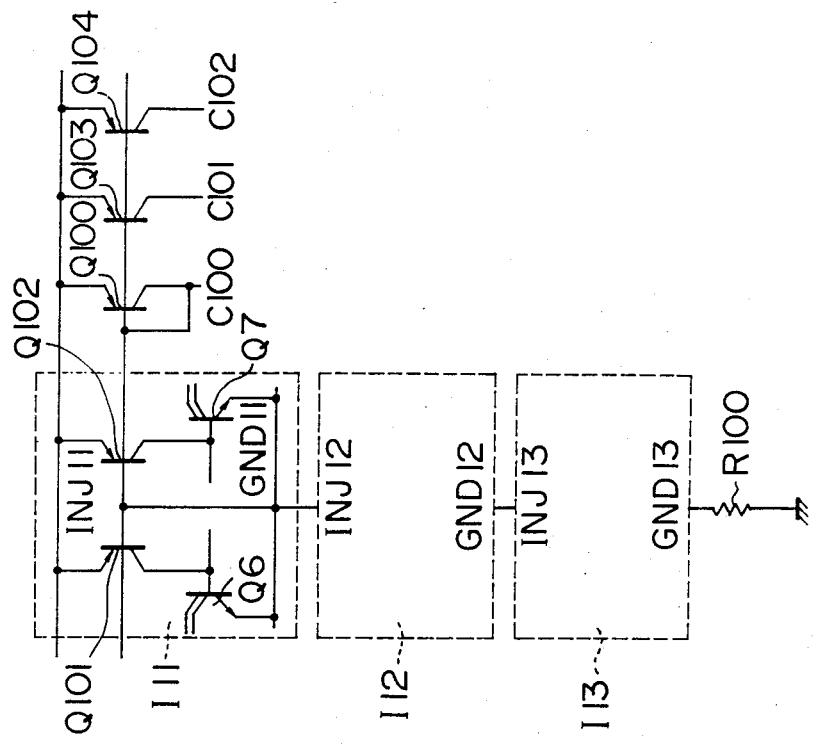
Figure 26:
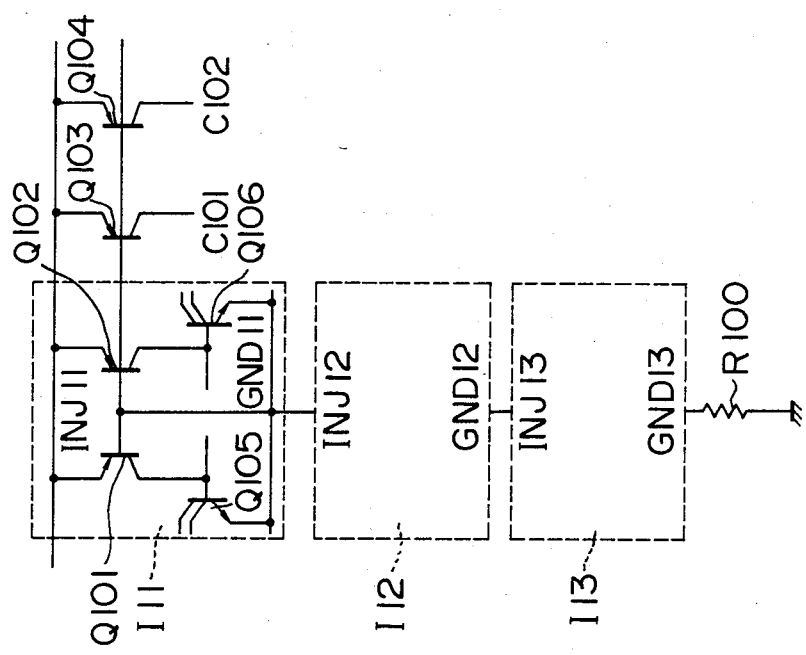
Figure 28A:
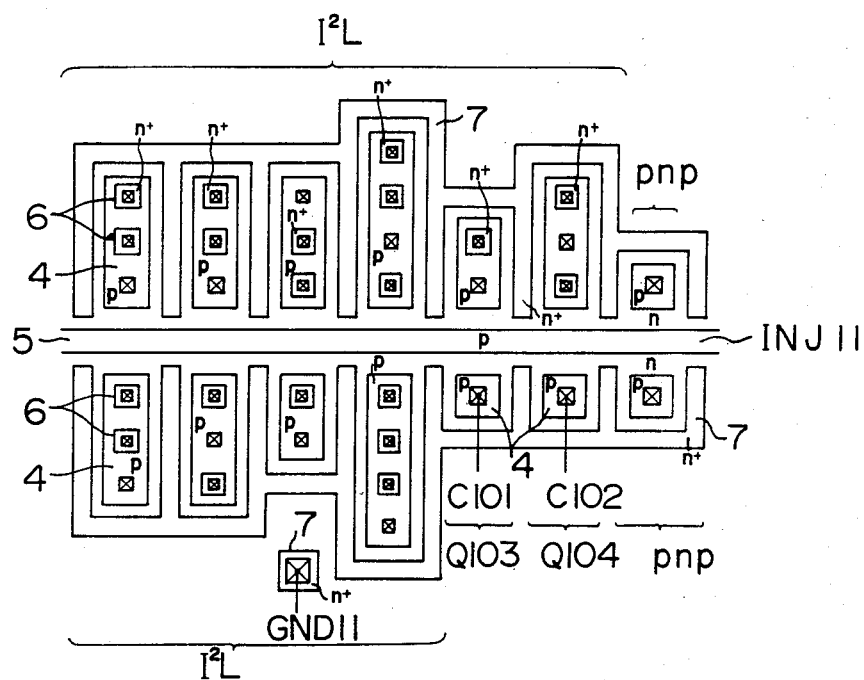
Figure 28B:
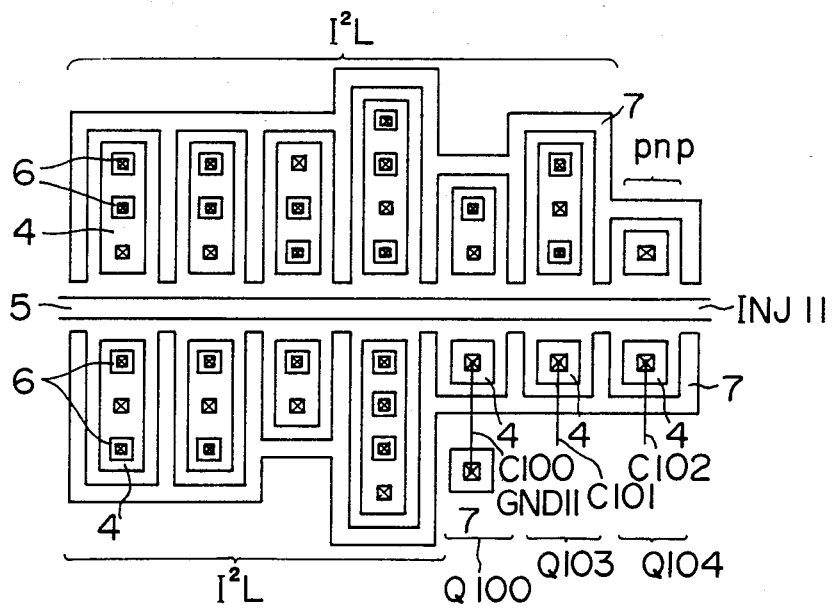

FIGS. 26 and 27 show constant current source circuits constituted by pnp-transistors in a manner heretofore known, wherein an I²L circuitry is formed in an isolated epitaxial region serving as the base of a pnp-transistor. A symbol R100 represents a load element. In the case of the circuit arrangement shown in FIG. 26, the constant currents flowing through collectors C101 and C102 of the transistors Q103 and Q104, respectively, are determined solely by the I²L circuitries I11, I12 and I13. On the other hand, FIG. 27 shows a structure in which the collector C100 of one pnp-transistor Q100 is connected to the base thereof to thereby assure much stabilized collector constant currents from the collectors C101 and C102 of the transisistors Q103 and Q104, respectively. In both embodiments shown in FIGS. 26 and 27, the injector terminals INJ 11 of the I²L circuitries also serve as the emitters of the pnp-transistors Q100, Q103 and Q104 which serve for supplying constant currents. Since the I²L circuitry of the first block I11 has a common ground line GND11 which is connected in common to the bases of the pnp-transistors Q100, Q103 and Q104, the I²L circuitries of the first block I11 can be formed in the isolated regions of the pnp-transistor Q100, Q103 and Q104 for the constant current supply. FIG. 28A shows in a plan view a layout pattern for the integration of the circuit shown in FIG. 26, while FIG. 28B shows in a plan view a layout pattern for the integration of the circuit shown in FIG. 27. As can be seen from FIGS. 28A and 28B, the emitter of the current-supplying pnp-transistor can be used in common as the injectors INJ11 of the I²L circuitry, allowing thus the pnp-transistor and the I²L circuitry to be disposed close to each other without necessity of interposing the isolation layer therebetween. Thus, the integration can be accomplished at a high packing density.

In the foregoing, description has been made of characteristic features and advantages of the invention applied to various circuits. Next, features and advantages of the invention applied to practical integrated circuits will be elucidated in the light of the integrated circuit structure on the whole.

Figure 29A:
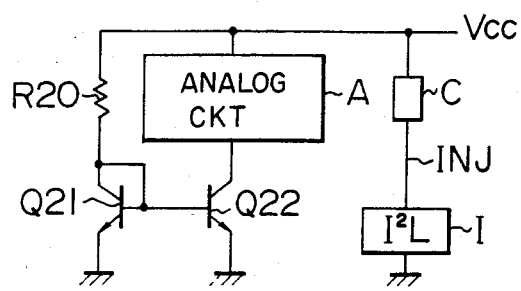
Figure 29B:
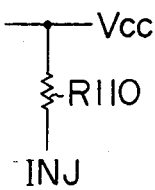
Figure 29C:
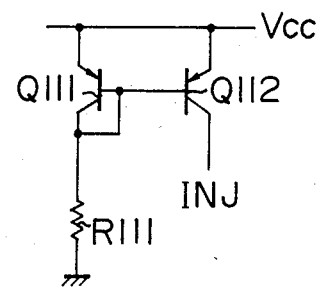

FIGS. 29A, 29B and 29C schematically illustrate current supply to an I²L circuitry incorporated in an integrated circuit. In the conventional integrated circuit, the I²L circuitry (I) and other circuits such as analogue circuit (A) are implemented independent of each other, as is illustrated in FIG. 29A. The current supply to the I²L circuitry at the injector thereof is realized with the aid of a constant current element denoted by a letter C in FIG. 29A. The constant current element C is usually constituted by a resistor R110 as shown in FIG. 29B or alternatively by pnp-transistors Q111 and Q112 as shown in FIG. 29C. With such circuit arrangement, there are required separately a current which is supplied to the analog circuit and a current supplied to the I²L circuitry, involving a significantly large current consumption as a whole.

Figure 30A:
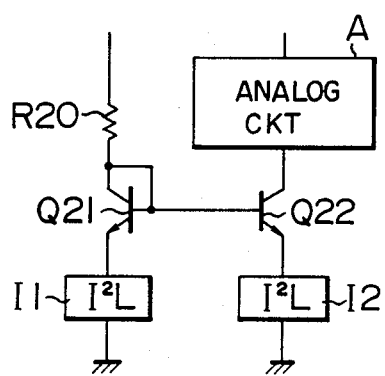
FIGS. 30A, 30B, 31A, 31B and 32 are views illustrating circuits which incorporate I²L circuitries in combination with analog or the like circuitries according to the teachings of the invention.
Figure 30B:
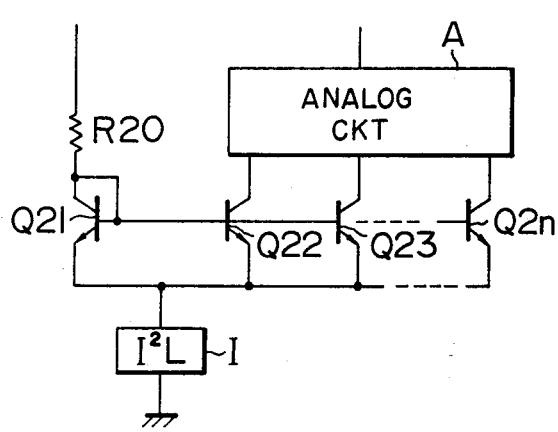

In contrast, the invention teaches that the I²L circuitries (I1, I2 or I) are inserted in the current paths of the conventional analog or other circuits, to thereby obviate the necessity of supplying especially the current to the I²L circuitries, as is illustrated in FIGS. 30A and 30B. Thus, the power consumption or dissipation of the whole integrated circuit can be remarkably reduced. FIG. 30A illustrates an exemplary circuit in which I²L circuitries are inserted in certain constant current paths. Since there exist numerous constant current locations in a given integrated circuit as a whole, it can be said that a great number of current supply sources are available for all the I²L gates incorporated in the integrated circuit.

By way of example, in the case of the integrated circuit shown in FIG. 29A, a current of 22mA inclusive of signal current is consumed by all the analogue circuits, wherein the part of the constant current is 11.3mA. The current consumed by the I²L circuitries amounts to about 20mA. For comparison, it should be mentioned that the total current consumption in the hitherto known integrated circuit will amount to 42mA. In contrast, when the I²L circuitries are inserted at locations of the analog circuits where constant currents flow according to the teaching of the invention, the corresponding total current consumption can be reduced to 30.7mA. This value can be further reduced by adopting such configuration as explained in connection with FIG. 23.

In this manner, there is no necessity of providing especially the current supply circuits for I²L circuitries according to various embodiments of the invention. The currents once utilized in the other circuits are again utilized for operation of the I²L circuitries, whereby the power consumption of the whole integrated circuit can be significantly reduced.

Figure 31A:
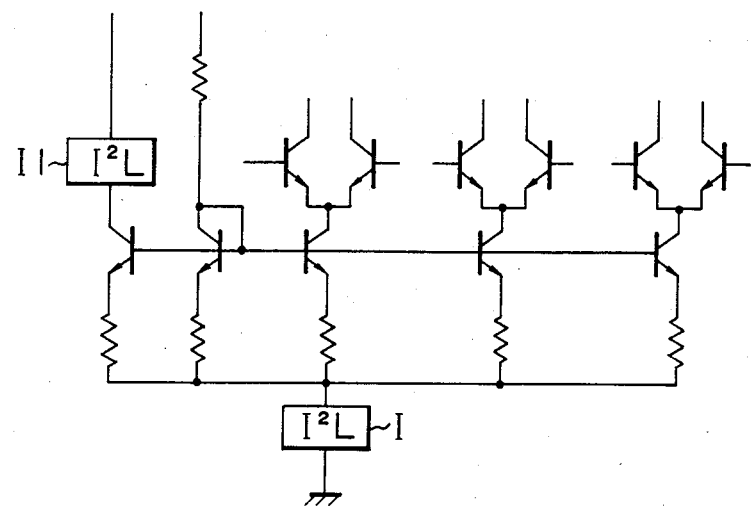
Figure 31B:
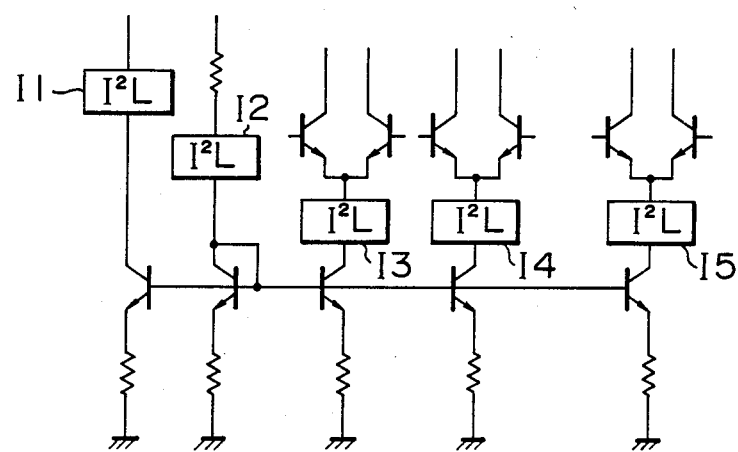

FIGS. 31A and 31B show exemplary embodiments of the invention in which I²L circuitries (I, I1, . . . , I5) are inserted in differential amplifier circuits at constant current locations thereof. Such differential circuit is employed very frequently in various integrated circuits. Besides, a great number of the differential circuits are often incorporated in a single chip. Thus, insertion of I²L circuitries in these differential circuits for doubly utilize the substantially constant current is very meaningful in reducing the power consumption of the whole integrated circuit.

Figure 32:
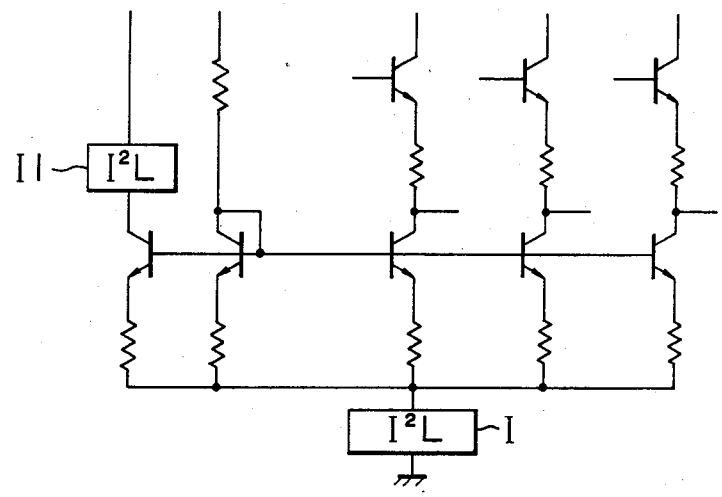

FIG. 32 shows still another embodiment of the invention in which the I²L circuitries are provided in a level shifting circuit. Since this type of circuit is used in various integrated circuits as often as the differential amplifier circuit, the use of the I²L circuitries in the level shifting circuits is also of much significance for reducing the power consumption of the integrated circuit on the whole.

In the foregoing description of the exemplary embodiments of the invention, it has been primarily assumed that the I²L circuitries are provided in analog circuits. However, it is equally possible to incorporate the I²L circuitries in other circuits such as logical operation circuits. For example, the differential amplifier circuits as described above can be employed in logical operation circuits termed CML and ECL. In the following, examples of the logical operation circuit to which the invention can be applied will be described.

Figure 33A:
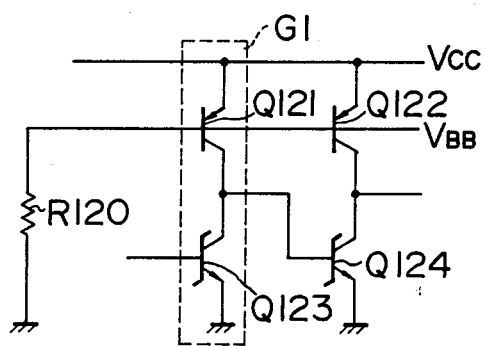
FIGS. 33A, 33B, 34A and 34B are views to illustrate configurations of CSTL circuits.
Figure 33B:
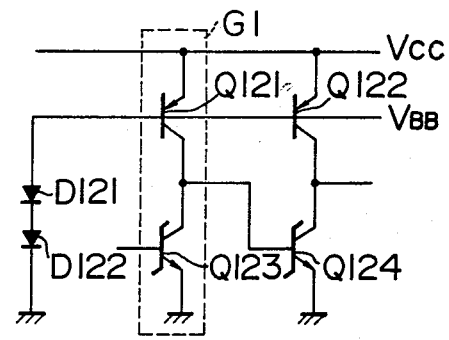
Figure 34A:
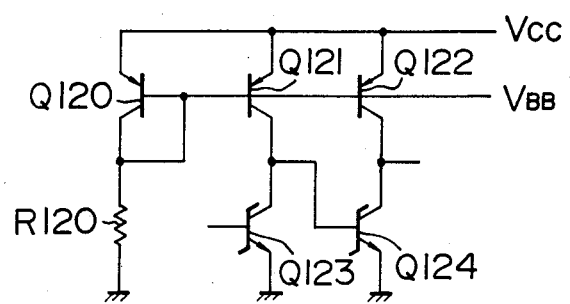
Figure 34B:
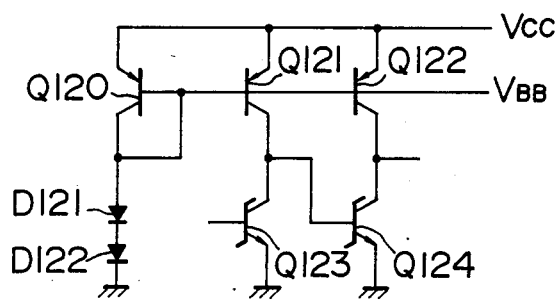
Figure 35A:
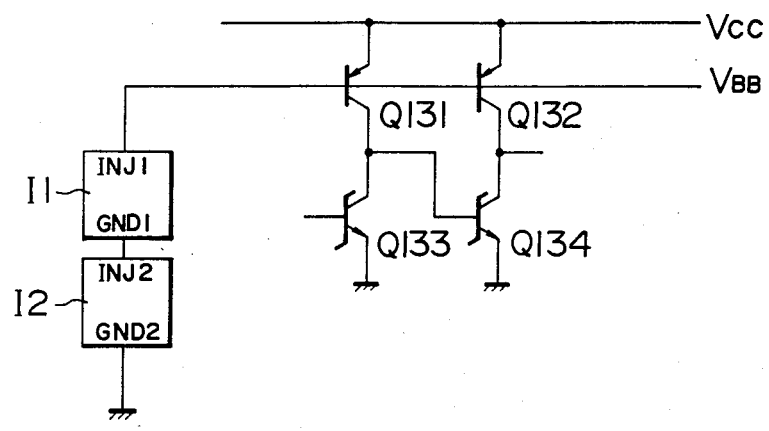
FIGS. 35A and 35B are views for illustrating an exemplary circuit incorporating I²L circuitries and a CSTL circuitry in combination according to another embodiment of the invention.
Figure 35B:
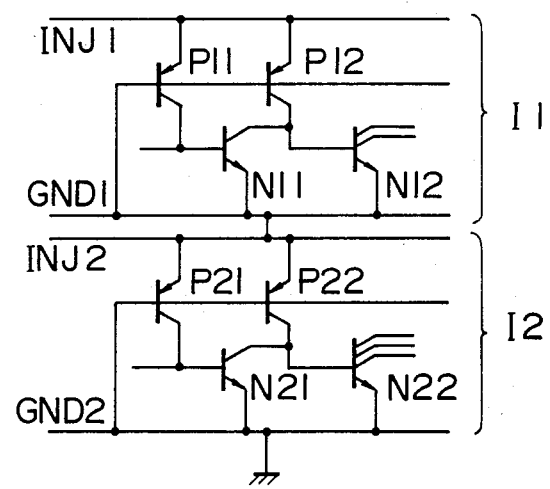

FIGS. 33A, 33B, 34A and 34B show logical operation circuits constituted by transistors Q123 and Q124 each provided with a clamping Schottky diode which are disclosed in Japanese Laid-Open Utility Model Specification No. 169454/1979. The load of an inverter gate G1 of the logical operation circuit is constituted by a pnp-transistor of constant current performance. The bases of the pnp-transistors constituting the logical operation circuit are biased through a resistor R120 as shown in FIG. 33A or by means of diodes D121 and D122 as shown in FIG. 34B or alternatively by means of a constant current source circuit as shown in FIGS. 34A and 34B. The Schottky clamp logic operation circuits are capable of operating at a speed about ten or more times as high as the operation of the usual $I^2L$ circuitry, and require a correspondingly increased current consumption. Thus, it is possible and advantageous to provide the $I^2L$ circuitries in the pnp-transistors of the logical operation circuits shown in FIGS. 33A and 33B in the manners described hereinbefore in conjunction with FIGS. 25B, 26 and 27. Further, it is also possible to provide the $I^2L$ circuitries connected to the bases of the pnp-transistor, as shown in FIGS. 35A and 35B, to thereby save currents for the $I^2L$ circuitries I1 and I2. The illustrated embodiment can be advantageously applied to such a system in which the high speed operation is attained by the circuits shown in FIGS. 33A and 33B while the low speed operation is to be realized by the $I^2L$ circuitries, whereby the necessity of separately providing the current for the $I^2L$ circuitries is obviated.

As will be appreciated from the foregoing description on the various embodiments of the invention, the present invention makes it possible to reduce significantly the power consumption or wastage of the integrated circuit on the whole by reusing the current which was once used in other coexistent circuits, for the operation of the low voltage circuit such as the $I^2L$ circuitries. The conventional integrated circuits have numerous circuit portions at which the reuse of current is permitted. Thus, the invention can be advantageously applied to substantially almost all kinds of the integrated circuits.

The requirement of the low power consumption or dissipation in the integrated circuit is essential in miniaturization and portableness of systems and will be of more and more importance. Needless to say, the devices capable of operating with a reduced power supply provide the users with a great advantage also from the economical viewpoint. The invention has now provided the low power operation devices and makes great contributions to the relevant fields economically and technologically.

We claim:

1. A semiconductor integrated circuit comprising an $I^2L$ circuit and a high voltage operation circuit operating at a higher voltage than that of said $I^2L$ circuit and implemented in coexistence with said $I^2L$ circuit in the same integrated circuit, wherein said $I^2L$ circuit is inserted in a series combination with said high voltage operation circuit between a first power supply terminal and a ground line, wherein said $I^2L$ circuit is connected between said high voltage operation circuit and said ground line and wherein the current flow through a portion of said high voltage circuit is substantially constant so as to provide a current source for said $I^2L$ circuit in addition to other functions and operations inherent to said high voltage operation circuit, to thereby allow the current once utilized by said high voltage operation circuit to be reused by said $I^2L$ circuit.

2. A semiconductor integrated circuit according to claim 1, wherein said high voltage operation circuit includes at least one of a constant voltage source circuit, a differential amplifier, a level shifting circuit and a logic circuit.

3. A semiconductor integrated circuit according to claim 1 or 2, wherein said $I^2L$ circuit includes a plurality of divided blocks which are connected in a stacked configuration.

4. A semiconductor integrated circuit according to claim 1, wherein said high voltage circuit includes a control terminal, and wherein said $I^2L$ circuit is coupled to said control terminal of said high voltage circuit to provide a constant current bias to said control terminal.

5. A semiconductor integrated circuit according to claim 4, wherein said high voltage circuit includes at least one bipolar transistor having both its collector and its base coupled to said $I^2L$ circuit, said base being said control terminal, so that said $I^2L$ circuit will provide said constant current bias to said base of said bipolar transistor to provide a constant current at the collector of said bipolar transistor.

6. A semiconductor integrated circuit according to claim 1, wherein the operating voltage of said $I^2L$ circuit is less than $\frac{1}{2}$ the operating voltage of the high voltage circuit.

7. A semiconductor integrated circuit according to claim 1, wherein the operating voltage of said $I^2L$ circuit is between $\frac{1}{3}$ and 1/15 the operating voltage of the high voltage circuit.

8. A semiconductor integrated circuit according to claim 1, wherein said high voltage operation circuit comprises a constant current circuit having a pair of transistors which have constant current flows in their emitter paths and wherein said $I^2L$ circuit is coupled to said emitter paths, said pair of transistors having their respective collectors coupled to said first power supply terminals, wherein one of said transistors has its collector coupled to its base.

9. A semiconductor integrated circuit according to claim 8, wherein said $I^2L$ circuit comprises first and second portions, wherein said first portion is coupled to the emitter path of the first transistor and the second portion is coupled to the emitter path of said second transistor.

10. A semiconductor integrated circuit according to claim 1, wherein said high voltage operation circuit comprises a constant voltage source circuit which includes a transistor and a diode circuit coupled to a base of said transistor, wherein said $I^2L$ circuit is coupled to receive a substantially constant current flowing through said diode circuit, and further wherein said transistor has a collector coupled to said first power supply terminal and an emitter coupled to said ground line.

11. A semiconductor integrated circuit according to claim 1, wherein said high voltage operation circuit comprises a constant voltage circuit having a transistor which has a substantially constant current flow at its emitter path, and wherein said $I^2L$ circuit is coupled to said emitter path, said transistor having a collector coupled to said first power supply terminal and a base coupled to a source of constant potential.

12. A semiconductor integrated cricuit according to claim 1, wherein said high voltage operation circuit comprises a differential amplifier having a pair of transistors, wherein said I²L circuit is coupled to respective emitters of said pair of transistors, and wherein respective collectors of said pair of transistors are coupled to one another and respective bases of said pair of transistors are each coupled to respectively receive input signals to be differentially amplified by said differential amplifier.

13. A semiconductor integrated circuit according to claim 1, wherein said high voltage operation circuit comprises a current compensation circuit having a pair of transistors whose combined emitter currents are substantially constant, wherein said I²L circuit is coupled to receive said combined emitter currents, said pair of transistors having their respective collectors coupled to said first power supply terminal, wherein the base of one of said transistors is coupled to the collector of the other of said transistors and further wherein the base of said other of said transistors is coupled to receive an input signal to said high voltage operation circuit while the emitter of said other of said transistors comprises an output terminal for said high voltage operation circuit.

14. A semiconductor integrated circuit according to claim 1, wherein said high voltage operation circuit comprises a constant current MOS circuit having a pair of MOS transistors which have a constant current flow along their drain-source paths, wherein said I²L circuit is coupled between one end of said drain-source paths of each of the MOS transistors and ground, wherein the other end of said drain-source paths of each of the MOS transistors is coupled to said first power supply terminal, wherein the respective gates of said MOS transistors are coupled to one another, and wherein said other end of said drain-source paths of one of said MOS transistors is coupld to its gate.

15. A semiconductor integrated circuit according to claim 1, wherein said high voltage operation circuit is an MOS circuit which includes a first MOS transistor and a constant current gate bias circuit for said first MOS transistor, wherein said I²L circuit is coupled to said constant current gate bias circuit, and wherein the drain-source path of said first MOS transistor is coupled between said first power supply terminal and said ground line.

16. A semiconductor integrated circuit according to claim 1, wherein said high voltage operation circuit comprises a constant current circuit including:
a first PNP transistor having an emitter coupled to said first power supply terminal, a collector coupled to said I²L circuit and a base coupled to said collector; and
second and third PNP transistors each having a base coupled to the base of the first transistor and an emitter coupled to said first power supply terminal, wherein the collectors of said first, second and third transistors are coupled together.

17. A semiconductor integrated circuit according to claim 1, wherein said high voltage operation circuit comprises a logic circuit comprising a pair of Schottky clamped transistors and first and second PNP load transistors having their collectors coupled, respectively, to collectors of said pair of Schottky clamped transistors, wherein said I²L circuit is coupled to the bases of said first and second PNP load transistors, wherein emitters of said first and second PNP load transistors are respectively coupled to said first power supply terminal, wherein the emitters of said pair of Schottky clamped transistors are respectively coupled to ground, wherein a base of one of said Schottky clamped transistors is coupled to receive an input signal for said high voltage operation circuit, wherein the collector of said one of said Schottky clamped transistors is coupled to the base of the other of said Schottky clamped transistors, and wherein the collector of said other of said Schottky clamped transistors comprises an output terminal for said high voltage operation circuit.

18. A semiconductor integrated circuit comprising an I²L circuit and a high voltage operation circuit operating at a higher voltage than that of said I²L circuit and implemented in coexistence with said I²L circuit in the same integrated circuit, wherein said I²L circuit is inserted in a series combinatin with said high voltage operation circuit between a first power supply terminal and a ground line, wherein said I²L circuit is connected between said first power supply terminal and said high voltage circuit and wherein the current flow through a portion of said high voltage circuit is substantially constant so that substantially all of the current flowing through said I²L circuit will be fed to said high voltage circuit.

19. A semiconductor integrated circuit according to claim 18, wherein said high voltage circuit includes a control terminal, and wherein said I²L circuit is coupled to said control terminal of said high voltage circuit to provide a constant current bias to said control terminal.

20. A semiconductor integrated circuit according to claim 19, wherein said high voltage circuit includes at least one bipolar transistor having both its collector and its base coupled to said I²L circuit, said base being said control terminal, so that said I²L circuit will provide said constant current bias to said base of said bipolar transistor to provide a constant current at the collector of said bipolar transistor.

21. A semiconductor integrated circuit accordng to claim 18, wherein the operating voltage of said I²L circuit is less than ½ the operating voltage of the high voltage circuit.

22. A semiconductor integrated circuit according to claim 18, wherein the operating voltage of said I²L circuit is between ⅓ and 1/15 the operating voltage of the high voltage circuit.

23. A semiconductor integrated circuit according to claim 18, wherein said high voltage operation circuit comprises a constant current circuit having a pair of transistors which have constant current flows in their collector paths, wherein said I²L circuit comprises first and second portions, and wherein said first portion of said I²L circuit is coupled to the collector path of said first transistor and the second portion of said I²L circuit is coupled to the collector path of said second transistor, and further wherein the bases of said first and second transistors are coupled to one another, the emitters of said first and second transistors are coupled to said ground line, and the base and collector of said first transistor are coupled together.

24. A semiconductor integrated circuit according to claim 18, wherein said high voltage operation circuit comprises a constant voltage circuit having a transistor which has a substantially constant current flow at its collector path, wherein said I²L circuit is coupled to said collector path, and wherein an emitter of said transistor is coupled to said ground line and a base of said transistor is coupled to a source of constant potential.

25. A semiconductor integrated circuit according to claim 18, wherein said high voltage operation circuit comprises a differential amplifier having a pair of transistors, wherein said I²L circuit is coupled to respective collectors of said pair of transistors, and wherein respective emitters of said pair of transistors are coupled to one another and respective bases of said pair of transistors are coupled to respectively receive input signals to be differentially amplified by said differential amplifier.

26. A semiconductor integrated circuit according to claim 18, wherein said high voltage operation circuit comprises a constant current MOS circuit having a pair of MOS transistors which have a constant current flow along their drain-source paths, wherein said I²L circuit is coupled between one end of said drain-source paths of each of said MOS transistors and said first power supply terminal, wherein the other end of said drain-source paths of each of the MOS transistors is coupled to said ground line, wherein the respective gates of said MOS transistors are coupled to one another, and wherein said other end of said drain-source paths of one of said MOS transistors is coupled to its gate.

* * * * *